Figure 1:
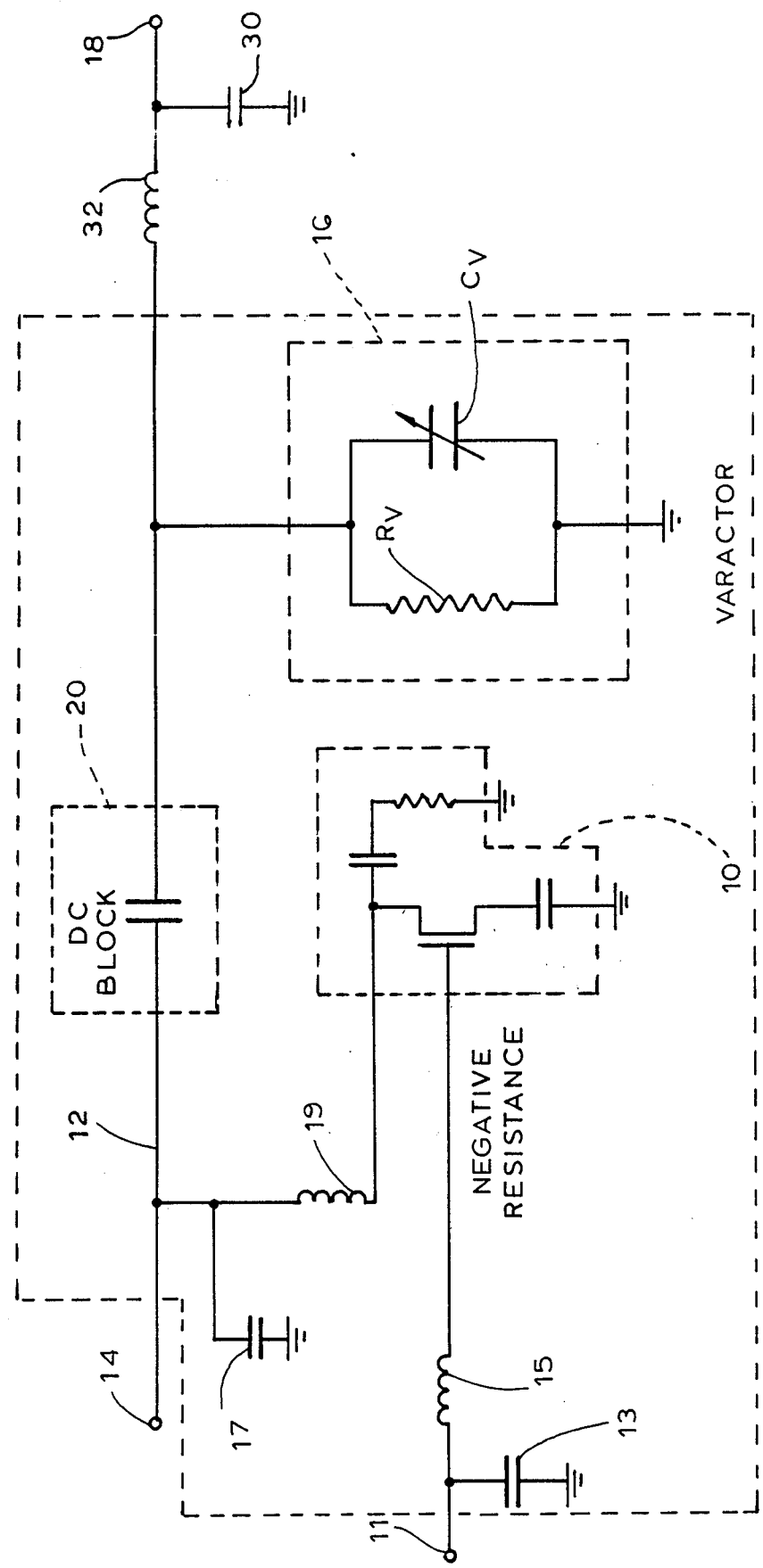

United States Patent [19]

Silverman

[11] Patent Number: 4,740,716
[45] Date of Patent: Apr. 26, 1988

[54] MONOLITHIC HIGH Q VARACTOR CIRCUIT

[75] Inventor: Lawrence H. Silverman, Dix Hills, N.Y.

[73] Assignee: General Instrument Corp., New York, N.Y.

[21] Appl. No.: 946,918

[22] Filed: Dec. 29, 1986

[51] Int. Cl.[4] .......................... H03J 3/20; H03K 3/26
[52] U.S. Cl. .................................. 307/320; 307/322; 307/258; 333/213
[58] Field of Search ............... 307/320, 321, 322, 323, 307/324, 258, 252 E; 333/213

[56] References Cited

U.S. PATENT DOCUMENTS

| | | | |
|---|---|---|---|
| 3,221,181 | 11/1965 | Kiyasu et al. | 307/320 |
| 3,458,715 | 7/1969 | Hartman | 307/324 |
| 4,430,630 | 2/1984 | Sakamoto | 334/15 |

Primary Examiner—Stanley D. Miller
Assistant Examiner—Richard Roseen
Attorney, Agent, or Firm—James & Franklin

[57] ABSTRACT

An active element behaving as a negative resistor is situated in parallel with a varactor to cancel the varactor losses. DC bias is provided for the active element and for the varactor which are separated by a DC block. The entire circuit can be fabricated on a single, relatively small chip. A Gunn diode may be used as the active element if the circuit is formed on a silicon substrate. A field effect transistor may be used as the active element on a gallium arsenide substrate.

2 Claims, 2 Drawing Sheets

MONOLITHIC HIGH Q VARACTOR CIRCUIT

The present invention relates to varactor circuits and, more particularly, to a very high Q varactor circuit which can be formed on a single, relatively small sized chip of gallium arsenide or silicon. Such a varactor circuit would be particularly useful as a high speed, tunable band reject or bandpass filter operating at microwave frequencies, especially at low voltages.

High speed tunable band reject or bandpass filters which employ tuning varactors are not practical in many applications because of the relatively large varactor losses. The present invention relates to a novel varactor circuit in which the varactor losses are compensated such that a super high Q is achieved. Such a circuit can be used in tuning filters at high speed. Another application could be as an oscillator where the varactor is stabilized by a driver in the form of the active element. The circuit also has the advantage of being fabricatable on a single minimum sized chip.

In general, the present invention consists of a monolithic circuit formed on a silicon or gallium arsenide substrate which includes an active element and a tuning varactor. The active element can be a Gunn diode if the circuit is formed on a silicon substrate or a field effect transistor if the circuit is formed on a gallium arsenide substrate.

The active element, when properly biased, will behave as a negative resistor. When placed in parallel with the resistance of the varactor, it compensates for the varactor losses. Accordingly, a very high Q varactor circuit is formed which is useful at microwave frequencies over the varactor's entire tuning range, especially at low voltages.

It is, therefore, a prime object of the present invention to provide a monolithic high Q varactor circuit.

It is another object of the present invention to provide a monolithic high Q varactor circuit which can be formed on either a gallium arsenide substrate or a silicon substrate.

It is another object of the present invention to provide a monolithic high Q varactor circuit suitable for use as a tunable band reject or bandpass filter in the microwave range.

It is another object of the present invention to provide a monolithic high Q varactor circuit which employs an active element to compensate for varactor losses.

It is another object of the present invention to provide a monolithic high Q varactor circuit which can be fabricated on a chip of relatively small size.

It is another object of the present invention to provide a monolithic high Q varactor circuit formed of conventional elements.

In accordance with the present invention, a monolithic circuit for use with first and second biasing signal source means is provided. The circuit includes negative resistance means and means for operably connecting the negative resistance means with the first biasing signal source means. The circuit also includes varactor means operably connected in parallel with the resistance means, and means for operably connecting the varactor means with the second biasing signal source means. DC blocking means are operably connected between the resistance means and the varactor means.

The resistance means comprises a Gunn diode when the circuit is formed on a silicon substrate. The resistance means comprises a field effect transistor which the circuit is formed on a gallium arsenide substrate.

Figure 2:
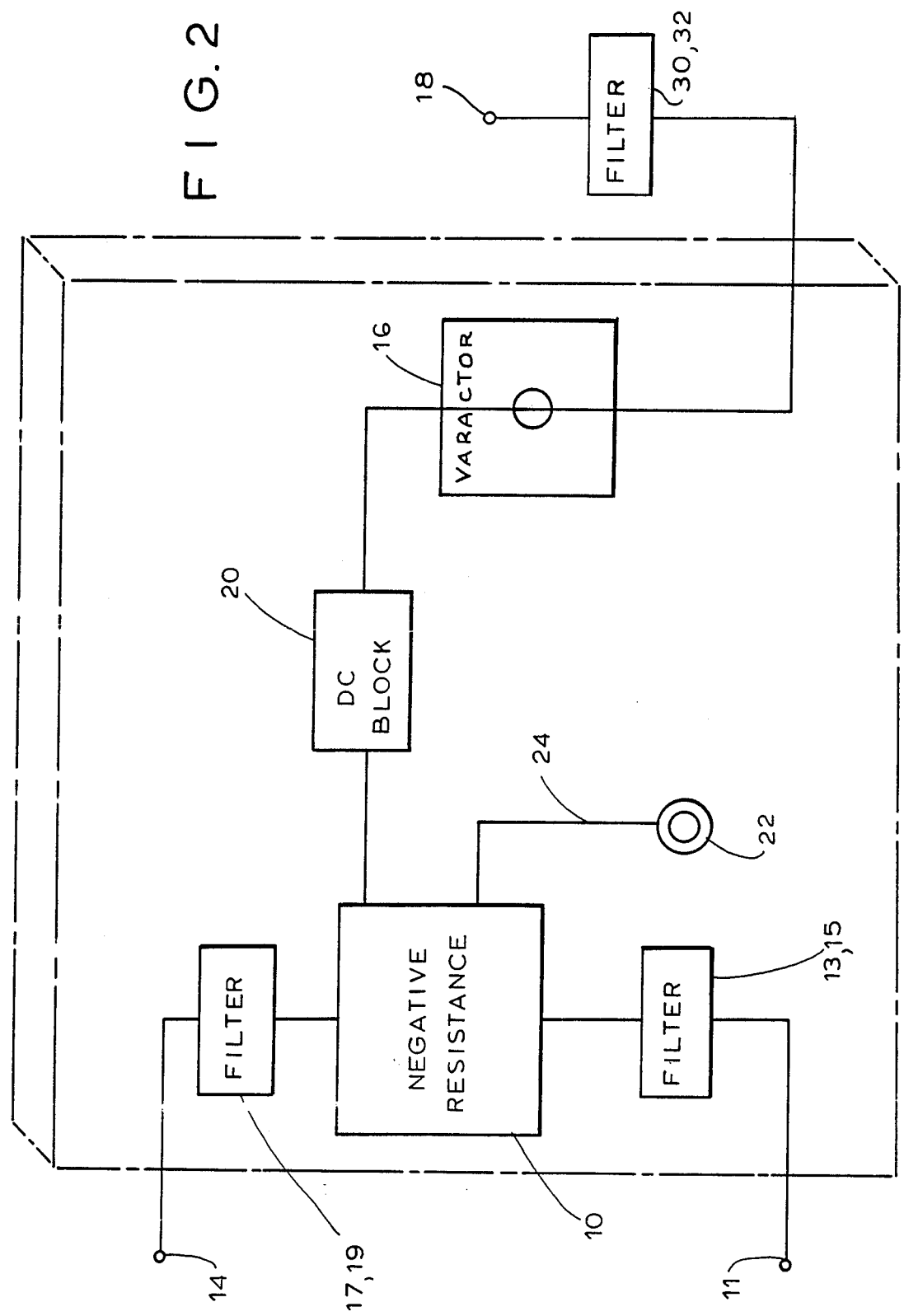

To these and to such other objects which may hereinafter appear, the present invention relates to a monolithic high Q varactor circuit, as set forth in the following specification and recited in the annexed claims, taken together with the accompanying drawings, wherein like numerals refer to like parts, and in which:

FIG. 1 is a schematic diagram of the monolithic high Q varactor circuit of the present invention; and FIG. 2 is an idealized diagram showing the lay-out of the circuit of the present invention on a gallium arsenide chip.

As seen in FIG. 1, the circuit of the present invention can be schematically represented by an active element 10 which is connected between ground and a bus 12 having a connecting node 14 upon which the appropriate DC bias for active element 10 is applied. In the event that element 10 is a field effect transistor, node 14 receives the drain voltage signal with the source being grounded. The gate electrode receives the gate signal through node 11. Between node 11 and the gate electrode also constitutes the radio frequency input to the circuit. Also connected between bus 12 and ground, in parallel with active element 10, is a varactor 16 which is schematically represented by a resistance $R_V$ and a capacitance $C_V$. The cathode of varactor 16 is connected to node 18. Node 18 has a DC bias applied thereto by an external source which includes a DC block 30 to ground and a choke 32, in order to tune the varactor. Node 18 also functions as the radio frequency output. Active element 10 and varactor 16 are separated by a DC block 20.

FIG. 2 illustrates the lay-out of the circuit of the present invention as it would appear fabricated on a monolithic chip having a gallium arsenide substrate. The chip itself would be approximately 60 mil $\times$ 60 mil. with a 5 mil. thickness, and thus relatively small in size. Active element 10 would take the form of a field effect transistor such as FET Model DXL 3608A from Dexel Corp. The drain electrode of the transistor is connected to an input 14 through filter 17, 19 and to ground through a resistor 21 (e.g. 5 ohms) and a DC block 22. The source of the FET is connected to ground through a capacitor 23 (e.g. 0.1 pf). Node 11 is connected to the gate electrode of the transistor through filter 13, 15. Node 14 is also connected to DC block 20 which, in turn, is connected to varactor 16 which may be a model #CVE 7800A from Alpha Industries. A node 18 functions as the RF output and varactor bias input.

Both element 10 and varactor 16 are connected to a ground layer on the bottom of the chip. With respect to the element 10, this is achieved by an opening 22 in the substrate which permits lead 24 to be directly connected to ground. The ground connection for varactor 16 cannot be observed because it is beneath the varactor.

When the varactor circuit of the present invention is formed on a silicon substrate, a Gunn diode will be substituted for the field effect transistor and act as the active element. The gate signal input will be eliminated and the other elements and chip lay-out will be essentially the same as shown in FIG. 2.

When properly biased, the active element will behave as a negative resistor in parallel with the resistance of the varactor to compensate for varactor losses. Accordingly, a very high Q varactor circuit results which can be used in the microwave range, between 4 and 9 GHz, for example, over the varactor's tuning range, especially at low voltages in the range of from 4 to 8 volts. At 4 GHz, Q's of over 11,000 at drain voltage and varactor bias equal to 4 v. to over 235,220 at drain voltage and varactor bias equal to 8 v. appear possible. At 9 GH, Q's of from about 1700 at 4 v. to 31,520 at 8 v. appear possible. Such a circuit is particularly useful as a high speed tunable band reject or bandpass filter.

In some cases, the DC bias signals for the active element and varactor may be approximately equal and, hence, a single bias signal source may be used for both. However, the DC bias control, in general, can be arbitrary since the circuit is such a high Q varactor circuit.

It will now be appreciated that the present invention relates to a monolithic high Q varactor circuit which includes a biased active element in parallel with a varactor and DC isolated therefrom so as to compensate for the resistance of the varactor and provide a super high Q varactor circuit for tuning filters at high speed. The entire varactor circuit can be fabricated on a single chip having a relatively small size.

While only a single preferred embodiment of the present invention has been disclosed herein for purposes of illustration, it is obvious that many variations and modifications could be made thereto. It is intended to cover all of these variations and modifications which fall within the scope of the present invention, as defined by the following claims:

I claim:

1. A monolithic microwave circuit for use with first and second bias signal sources comprising an RF input, an RF output, negative resistance means, means for operably connecting said resistance means to the first bias signal source and said RF input at a first node, DC blocking means, varactor means operably connected in parallel with said resistance means, and means for operably connecting said varactor means to said second bias signal source and said RF output at a second node, DC blocking means operably interposed between said first and second nodes, wherein said negative resistance means comprises a field effect transistor formed on a gallium arsenide substrate.

2. The circuit of claim 1, for use with a gate signal source and further comprising means for operably connecting said transistor to said gate signal source.

* * * * *